United States Patent
Hafed

(10) Patent No.: US 7,917,319 B2
(45) Date of Patent: Mar. 29, 2011

(54) SYSTEMS AND METHODS FOR TESTING AND DIAGNOSING DELAY FAULTS AND FOR PARAMETRIC TESTING IN DIGITAL CIRCUITS

(75) Inventor: Mohamed M. Hafed, Montreal (CA)

(73) Assignee: DFT Microsystems Inc., Burlington, MA (US)

( * ) Notice: Subject to any disclaimer, the term of this patent is extended or adjusted under 35 U.S.C. 154(b) by 404 days.

(21) Appl. No.: 12/026,760

(22) Filed: Feb. 6, 2008

(65) Prior Publication Data
US 2009/0198461 A1 Aug. 6, 2009

(51) Int. Cl.
  G01R 31/26 (2006.01)
  G06F 11/26 (2006.01)
(52) U.S. Cl. ............ 702/69; 702/79; 702/117; 702/118; 702/125; 714/718; 714/731
(58) Field of Classification Search .............. 702/69, 702/79, 80, 117, 118, 125
See application file for complete search history.

(56) References Cited

U.S. PATENT DOCUMENTS

| | | | |
|---|---|---|---|
| 3,931,610 A | 1/1976 | Marin et al. | |
| 3,976,940 A | 8/1976 | Chau et al. | |
| 4,677,648 A | 6/1987 | Zurfluh | |
| 4,807,147 A | 2/1989 | Halbert et al. | |
| 5,329,258 A | 7/1994 | Matsuura | |
| 5,349,587 A * | 9/1994 | Nadeau-Dostie et al. | 714/729 |
| 5,517,147 A | 5/1996 | Burroughs et al. | |
| 5,563,921 A | 10/1996 | Mesuda et al. | |
| 5,606,567 A * | 2/1997 | Agrawal et al. | 714/732 |
| 5,835,501 A | 11/1998 | Dalmia et al. | |
| 5,883,523 A | 3/1999 | Ferland et al. | |
| 5,948,115 A | 9/1999 | Dinteman | |
| 6,008,703 A | 12/1999 | Perrott et al. | |
| 6,057,679 A | 5/2000 | Slizynski et al. | |
| 6,076,175 A | 6/2000 | Drost et al. | |
| 6,091,671 A | 7/2000 | Kattan | |
| 6,181,267 B1 | 1/2001 | MacDonald et al. | |
| 6,225,840 B1 | 5/2001 | Ishimi | |
| 6,329,850 B1 | 12/2001 | Mair et al. | |

(Continued)

FOREIGN PATENT DOCUMENTS

JP    2005006071 A    1/2005

OTHER PUBLICATIONS

First Examination Report issued by European Patent Office dated Nov. 16, 2009, in connection with related European Patent Appl. No. 05744211.3, filed May 2, 2005, entitled System and Method for Generating a Jittered Test Signal, Hafed, Mohamed M. et al.

(Continued)

*Primary Examiner* — Hal D Wachsman
(74) *Attorney, Agent, or Firm* — Downs Rachlin Martin PLLC

(57) ABSTRACT

Delay-fault testing and parametric analysis systems and methods utilizing one or more variable delay time-base generators. In embodiments of the delay-fault testing systems, short-delay logic paths are provided with additional scan-chain memory elements and logic that, in conjunction with the one or more variable-delay time-base generators, provides the effect of over-clocking without the need to over-clock. Related methods provide such effective over-clocking. In embodiments of parametric analysis systems, test point sampling elements and analysis circuitry are clocked as a function of the output of the one or more variable-delay time-base generators to provide various parametric analysis functionality. Related methods address this functionality.

10 Claims, 10 Drawing Sheets

U.S. PATENT DOCUMENTS

| | | |
|---|---|---|
| 6,356,850 B1 | 3/2002 | Wilstrup et al. |
| 6,374,388 B1 | 4/2002 | Hinch |
| 6,420,921 B1 | 7/2002 | Okayasu et al. |
| 6,570,454 B2 | 5/2003 | Skierszkan |
| 6,629,274 B1 | 9/2003 | Tripp et al. |
| 6,640,193 B2 | 10/2003 | Kuyel |
| 6,650,101 B2 | 11/2003 | MacDonald et al. |
| 6,658,363 B2 | 12/2003 | Mejia et al. |
| 6,665,808 B1 | 12/2003 | Schinzel |
| 6,768,360 B2 | 7/2004 | Tsuruki |
| 6,768,390 B1 | 7/2004 | Dunsmore et al. |
| 6,775,809 B1 | 8/2004 | Lambrecht et al. |
| 6,785,622 B2 | 8/2004 | Nygaard, Jr. |
| 6,791,389 B2 | 9/2004 | Mikami et al. |
| 6,816,987 B1 | 11/2004 | Olson et al. |
| 6,816,988 B2 | 11/2004 | Barford |
| 6,834,367 B2 | 12/2004 | Bonneau et al. |
| 6,842,061 B2 | 1/2005 | Suda et al. |
| 6,859,106 B2 | 2/2005 | Sano |
| 6,865,222 B1 | 3/2005 | Payne |
| 6,865,496 B2 | 3/2005 | Camnitz et al. |
| 6,868,047 B2 | 3/2005 | Sartschev et al. |
| 6,888,412 B2 | 5/2005 | Kim et al. |
| 6,907,553 B2 | 6/2005 | Popplewell et al. |
| 6,909,316 B2 | 6/2005 | Owens et al. |
| 6,909,980 B2 | 6/2005 | Fernando |
| 6,918,073 B2 | 7/2005 | Linam et al. |
| 6,931,579 B2 | 8/2005 | Roberts et al. |
| 6,934,896 B2 | 8/2005 | Larson et al. |
| 6,940,330 B2 | 9/2005 | Okayasu |
| 6,944,835 B2 | 9/2005 | Okayasu |
| 6,961,745 B2 | 11/2005 | Laquai |
| 6,993,109 B2 | 1/2006 | Lee et al. |
| 7,136,772 B2 | 11/2006 | Duchi et al. |
| 7,287,200 B2 | 10/2007 | Miyaji |
| 7,355,378 B2 | 4/2008 | Rottacker et al. |
| 2001/0028251 A1 | 10/2001 | Okayasu |
| 2002/0019962 A1 | 2/2002 | Roberts et al. |
| 2002/0033878 A1 | 3/2002 | Satoh et al. |
| 2002/0147951 A1* | 10/2002 | Nadeau-Dostie et al. .... 714/731 |
| 2003/0122600 A1 | 7/2003 | Engl et al. |
| 2003/0128720 A1 | 7/2003 | Jones |
| 2003/0165051 A1 | 9/2003 | Kledzik et al. |
| 2003/0198311 A1 | 10/2003 | Song et al. |
| 2004/0051571 A1 | 3/2004 | Okamura |
| 2005/0014300 A1 | 1/2005 | Welch et al. |
| 2005/0046584 A1 | 3/2005 | Breed |
| 2005/0058234 A1 | 3/2005 | Stojanovic |
| 2005/0094927 A1 | 5/2005 | Kish et al. |
| 2005/0286436 A1 | 12/2005 | Flask |
| 2006/0005093 A1 | 1/2006 | Leslie |
| 2006/0139387 A1 | 6/2006 | Silverbrook et al. |
| 2007/0113119 A1 | 5/2007 | Hafed |
| 2008/0013456 A1 | 1/2008 | Hafed |
| 2008/0048726 A1 | 2/2008 | Hafed |
| 2008/0192814 A1 | 8/2008 | Hafed |

OTHER PUBLICATIONS

Shimanouchi, Masashi, Periodic Jitter Injection with Direct Time Synthesis by SPP ATE for SerDes Jitter Tolerance Test in Production, ITC International Test Conference; Paper 3.1; 0-7803-8106; Aug. 2003; IEEE, pp. 48-57.

Notice of Allowance dated Oct. 28, 2009, with regard to related U.S. Appl. No. 11/776,825, filed Jul. 12, 2007, Mohamed M. Hafed.

First Office Action dated Sep. 2, 2009 in connection with related U.S. Appl. No. 11/776,865, filed Jul. 12, 2007, entitled "High-Speed Signal Testing System Having Oscilloscope Functionality," Inventor: Mohamed Hafed.

Hafed et al., "A High-Throughput 5 GBPS Timing and Jitter Test Module Featuring Localized Processing," International Test Conference 2004, Oct. 26, 2004-Oct. 28, 2004 Charlotte Convention Center, Charlotte, NC, ETATS-UNIS (2004), IEEE Catalog No. 04CH37586, ISBN: 0-7803-8580-2, pp. 728-737.

Hafed, et al., "An 8-Channel, 12-bit, 20 MHz Fully Differential Tester IC For Analog and Mixed-Signal Circuits," Solid-State Circuits Conference, 2003, ESSCIRC 2003, proceedings of the 29th European; Published Sep. 16, 2003, pp. 193-196; ISBN: 0-7803-7995-0.

Hafed et al., "A 5-Channel, Variable Resolution 10-GHz Sampling Rate Coherent Tester/Oscilloscope IC and Associated Test Vehicles," IEEE Mar. 2003, Custom Integrated Circuits Conference, pp. 621-624.

Hafed et al., "A 4-GHz Effective Sample Rate Integrated Test Core for Analog and Mixed-Signal Circuits," IEEE Journal of Solid-State Circuits, vol. 37, No. 4, Apr. 2002, pp. 499-514.

Hafed et al., "Test and Evaluation of Multiple Embedded Mixed-Signal Test Cores," International Test Conference 2002, paper 35.3, ISBN 0-7803-7542-4, pp. 1022-1030.

Hafed et al., "Sigma-Delta Techniques for Integrated Test and Measurement," IEEE Instrumentation and Measurement Technology Conference, Budapest, Hungary, May 21-23, 2001; 0-7803-6646.

Larsson, Patrick, "A 2-1600-MHz CMOS Clock Recovery PLL with Low-Vdd Capability," In Solid-State Circuits, IEEE Journal, Dec. 1999, vol. 34, Issue 12, pp. 1951-1960.

International Search Report and Written Opinion dated Feb. 12, 2008 for corresponding PCT application PCT/US06/60295 filed Oct. 27, 2006 entitled "High-Speed Transceiver Tester Incorporating Jitter Injection," Hafed et al.

Mohamed Hafed et al, "Massively Parallel Validation of High-Speed Serial Interfaces Using Compact Instrument Modules," IEEE, International Test Conference, Paper 9.2; 1-4244-0292, Jan. 2, 2006, pp. 1-10.

International Search Report and Written Opinion dated Jul. 22, 2008 for related application PCT/US08/53476 filed Feb. 8, 2008 entitled "System and Method for Physical-Layer Testing of High-Speed Serial Links in their Mission Environment," Hafed et al.

International Search Report and Written Opinion dated Mar. 11, 2008 for related application PCT/US07/73458 filed Jul. 13, 2007 entitled "High-Speed Signal Testing System Having Oscilloscope Functionability," Hafed.

International Search Report and Written Opinion dated Aug. 1, 2008 for related application PCT/US07/73454 filed Jul. 13, 2007 entitled "Signal Integrity Measurement System and Methods Using a Predominantly Digital Time-Base Generator," Hafed.

* cited by examiner

NO OR MINIMAL
SWITCHING ACTIVITY

SYSTEMS AND METHODS FOR TESTING AND DIAGNOSING DELAY FAULTS AND FOR PARAMETRIC TESTING IN DIGITAL CIRCUITS

FIELD OF INVENTION

The present invention relates generally to integrated circuits testing and diagnosis. More particularly, the present invention is directed to systems and methods for testing and diagnosing delay faults and for parametric testing in digital circuits.

BACKGROUND

Various new failure mechanisms plague modern nanometer-scale integrated circuits. Reduced voltage swings, increased current consumption, the introduction of new materials, and unprecedented densities render such circuits increasingly sensitive to phenomena like local temperature variations within a chip, local power supply voltage variations, clock jitter, and small resistive/capacitive defects. A common theme among these effects is that they are not uncovered using conventional debug and test methods. In other words, failures due to these effects do not manifest themselves in conventional ways; rather, they are timing related. Simplistically, they affect the maximum speed at which a circuit can operate in its mission environment. In the present state of the art, conventional test methods do not cover timing-related faults effectively. Thus, the latter represent a significant risk of increased test escapes, which are defined as failing parts that are not caught before shipment, or increased reliability escapes, which are defined as functional parts that suffer from premature failure in the field.

To deal with the mentioned new integrity issues in digital chips, recent attempts have been made to enhance test coverage and reliability. An example relates to power supply measurement during debug and diagnosis. Some have attempted to integrate process monitors for this purpose, the most common embodiment of which is a ring oscillator. If the power supply voltage to a ring oscillator is reduced due to excessive IR drop, its oscillation frequency decreases. Counting the number of times a ring oscillator toggles over a certain duration reveals its oscillation frequency and consequently the amount of power supply drop that it suffers from.

When it comes to testing chips in large volume, ring-oscillator monitors become ineffective since they require calibration and offer too little resolution. During production test, delay faults, which are timing-related faults that result from the various signal integrity issues identified earlier, necessarily need to be addressed another way. In the present state of the art, software-based automated test pattern generation and over-clocking techniques are used. Small delay faults are notorious in that they pass conventional structural test methods without being detected. That is, test vectors created using conventional test pattern generation techniques do not fail even if a timing-related defect actually exists in the manufactured component. To deal with this, engineers commonly excite a device under test with the same conventional test vectors, but they run them at speeds that may exceed the nominal functional speed. Monitoring vectors that pass at low speed and fail at high speed gives insights into possible delay faults. Unfortunately, a failing over-speed vector does not necessarily mean the part being tested is really defective since the latter was not designed to operate at this fast clock frequency in the first place.

SUMMARY OF THE DISCLOSURE

In one implementation, the present invention is directed to an integrated circuit. The integrated circuit includes: combinational logic that includes a number N of data paths; a functional clock network responsive to a reference clock so as to provide a functional clock signal; a time-base generator responsive to the reference clock so as to provide a time-base clock signal; a scan chain comprising at least N scannable memory elements each operatively connected to the functional clock network and to corresponding respective data paths of the N data paths so as to capture data from the corresponding respective data paths in response to the functional clock signal; and an additional memory element operatively connected to the time-base generator and to a particular data path of the N data paths so as to capture data from the particular data path in response to the time-base clock signal.

In another implementation, the present invention is also directed to an integrated circuit. The integrated circuit includes: combinational logic having a plurality of data paths; and delay-fault testing circuitry that includes: a functional clock circuit for clocking ones of the plurality of data paths with a first clock signal having a period; a time-base clock circuit for, simultaneously with the clocking by the functional clock circuit, clocking at least one of the plurality of data paths with a second clock signal that is delayed or advanced relative to the first clock signal; and launch-capture circuitry operatively configured to provide the at least one of the plurality of data paths with an effective launch-capture cycle that is smaller than the period of the first clock signal.

In a further implementation, the present invention is directed to a method of performing delay-fault testing on an integrated circuit. The method includes: providing an integrated circuit comprising combinational logic that includes a plurality of data paths outputting corresponding respective data bits to a plurality of memory elements; clocking the combinational logic and ones of the plurality of memory elements with a first clock signal having a period; simultaneously with the clocking with the first clock signal, providing a particular memory element of the plurality of memory elements with a shorter launch-capture cycle that is shorter than the period of the first clock signal, the shorter launch-capture cycle being implemented using two separate, but simultaneous, delayed clocks; and determining whether a delay fault occurred on the particular data path of the plurality of data paths corresponding to the particular memory element provided with the shorter launch-capture cycle as a function of the shorter launch-capture cycle.

In yet another implementation, the present invention is directed to a method of implementing delay-fault testing for an integrated circuit. The method includes: during a design phase of designing an integrated circuit, identifying small delay paths from a plurality of data paths; providing ones of the plurality of data paths with a corresponding respective plurality of first scannable memory elements; providing the integrated circuit with additional, second scannable memory elements to the outputs of the small delay paths; providing the integrated circuit with further, third scannable memory elements in communication with corresponding respective ones of the second scannable memory elements, the third scannable memory elements for capturing delay-fault signals; providing the integrated circuit with a functional clock network for providing a first clock signal to the plurality of data paths and the plurality of first scannable memory elements; providing the integrated circuit with a time-base generator for providing a second clock signal to the second scannable memory elements, the second clock signal having a delay relative to the first clock signal; programming the time-base generator so that the delay is an optimal value; scanning appropriate data values for transition fault testing into the plurality of first scannable memory elements and the second scannable memory elements; performing the transition fault testing using the first and second clock signals simultaneously with one another; and subsequent to the performing of the transition fault testing, scanning test values out of at least the third scannable memory elements.

In still a further implementation, the present invention is directed to another integrated circuit. The integrated circuit includes: a functional clock network for providing a first clock signal; combinational logic responsive to the first clock signal; a time-base generator for providing a second clock signal having a programmed delay relative to the first clock signal; a test-point sampling element having a data input in communication with the functional clock network or the combinational logic for sampling values of a signal under test, the test-point sampling element responsive to the second clock signal; and analysis circuitry in communication with the test-point sampling element, the analysis circuitry for counting as a function of the values sampled by the test-point sampling element.

In still a further implementation, the present invention is directed to a method of measuring a parameter of a signal under test in an integrated circuit. The method includes: providing an integrated circuit that generates a periodic signal having a frequency; generating from within the integrated circuit a time-base signal having the frequency of the periodic signal and a variable delay relative to the periodic signal; sampling, with a one-bit sampler over a number N of cycles of the time-base signal, the periodic signal in response to the time time-base signal a plurality of times each having a differing value of the variable delay; and for each of the plurality of times, counting over the N cycles the number of sampled occurrences of a particular bit value captured by the one-bit sampler.

In still yet another implementation, the present invention is directed to a method of measuring a parameter of a signal under test in an integrated circuit. The method includes: providing an integrated circuit that generates a periodic signal having a frequency; generating from within the integrated circuit a time-base signal having the frequency of the periodic signal and a variable delay relative to the periodic signal; sampling, with a one-bit sampler over a number N of cycles of the time-base signal, the periodic signal in response to the time time-base signal a plurality of times each having a differing value of the variable delay; and for each of the plurality of times, counting over the N cycles the number of sampled occurrences of a particular bit value captured by the one-bit sampler.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

At a high level, the present invention relates to the test and mitigation of the issues described above in the Background section during two distinct phases: debug/diagnosis and production testing. These two phases have slightly different logistical requirements, but they are equally important for quality maintenance at any chip or digital system provider.

The logistical differences relate to test time, amount of data collection, and test data availability. The electrical requirements, on the other hand, are similar. The goal of both is to screen subtle timing-related failures that are not screened using conventional structural test techniques.

Given the situation described in the Background section above, there is a dire need for new on-chip measurement solutions for both production testing and debug/diagnosis. This disclosure describes delay-fault test circuits and methods that significantly enhance coverage for both production testing as well as debug and diagnostics. The circuits described in this disclosure have the property that they do not require any custom transistor-level circuit techniques to be implemented. They can be synthesized automatically using standard cell libraries. This property makes the proposed invention not only applicable to ASIC-based digital circuits but also to off-the-shelf field-programmable gate array (FPGA) technologies. Specifically, designers targeting FPGA technology can now have at their disposal the disclosed circuits and techniques for small delay fault debug and test.

1.0 Fundamentals

Figure 1:
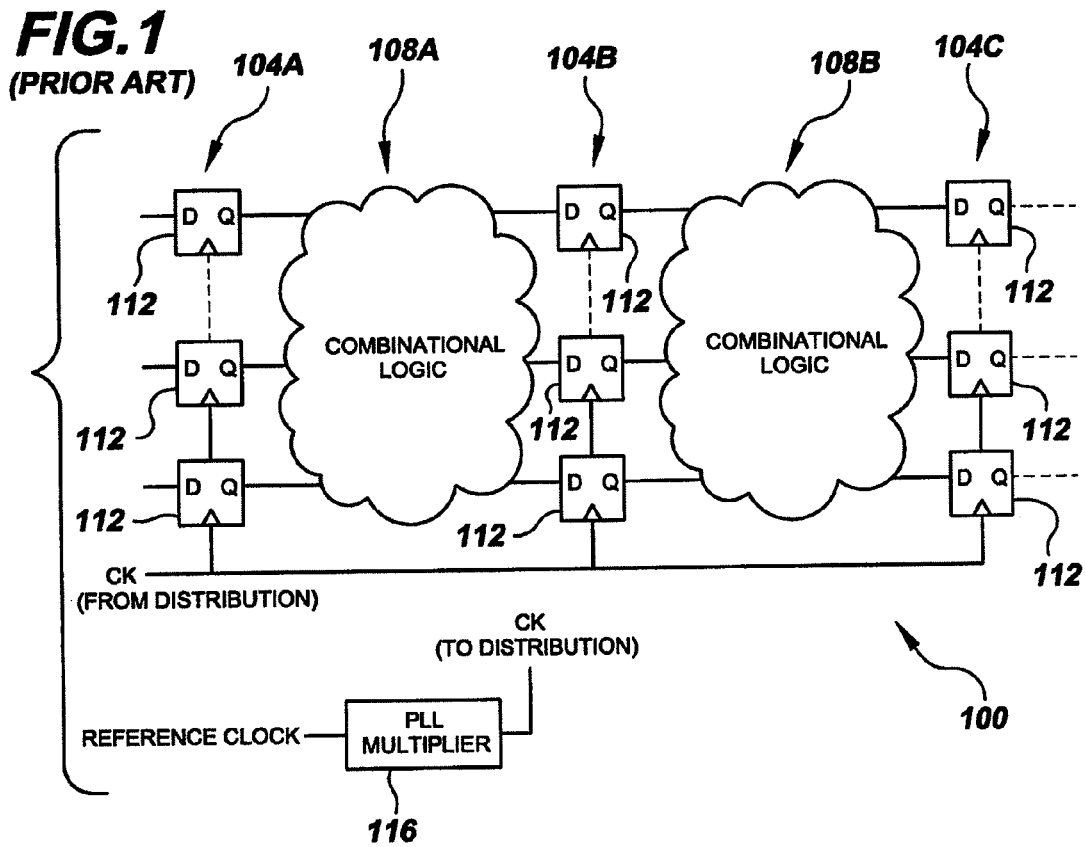
FIG. 1 is a high level schematic diagram of conventional digital circuitry that can be modified in accordance with the present disclosure to provide enhanced delay-fault testing, diagnostics, and/or repair of such circuitry.

FIG. 1 shows a typical digital circuit 100 that may be integrated in a nanometer-scale technology. In this example circuit 100 is a sequential circuit consisting of various memory stages 104A-C and combinational logic blocks 108A-B. The memory elements of stages 104A-C can be made of flip-flops 112 or of another type of memory elements, such as latches (not shown). Circuit 100 is clocked at high frequency. Typically, one or more clock multiplier PLLs 116 are used to take a slow reference clock from another part of the integrated circuit or from the outside world and then multiply this reference clock to the high frequency. Alternatively, a DLL is used. In any case, digital circuits, such as digital circuit 100, operate at very high speeds in modern devices. Here, "high speed" is defined as frequencies in excess of several hundred Megahertz. This means that a transition that occurs from a flip-flop 112 (or a memory element in general) in stage 104A has very little time to propagate through the combinational logic and the associated interconnecting wires before arriving at a flip-flop in stage 104B. All transitions at the input of such flip-flop in stage 104B need to have completely settled before the next clock edge arrives. With high speeds, jitter on the clock signal CK becomes important. Equivalently, simultaneous switching activity causes local temperature gradients and local power supply drops (IR drops). These manifest themselves as additional delay in the signal propagation paths, additional jitter in clock signal CK and in the data paths, or both. Subsequent sections of this disclosure describe approaches for unique measurement macros and methods for testing these effects. Also described below are macros and methods for diagnosing and testing for some of these effects during debug and diagnosis.

Figure 2A:
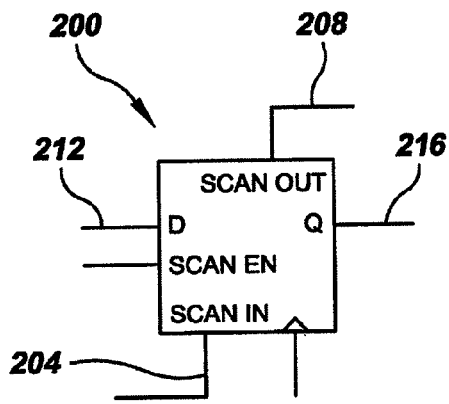
FIG. 2A is a schematic diagram of a conventional scannable memory element usable with various embodiments of the present invention.
Figure 2B:
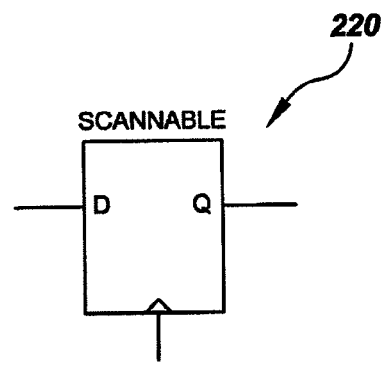
FIG. 2B is a compact representation of the scannable memory element used in various figures of this disclosure.

To enable timely and cost-effective production testing of digital circuits, these circuits, such as circuit 100 in FIG. 1, are often augmented with design-for-test (DFT) features, such as low-speed scan paths through all of memory elements 112. Referring to FIG. 2A, which illustrates a conventional scannable memory element 200, the most common DFT implementation in the industry is to enable a scan input 204 and a scan output 208 on each of the memory elements in a circuit. Then, during testing, instead of passing functional vectors from the left to the right in integrated circuit 100 of FIG. 1, for example, all memory elements 112 in the circuit or a part of the circuit are daisy chained together through their scan inputs and outputs (each similar to the corresponding respective input and output 204, 208); i.e., each scan output is connected to a corresponding scan output of neighboring memory element while the D-input (212 in FIG. 2A) and Q-output (216 in FIG. 2A) maintain their functional design-specific connections. Deterministic states are relatively slowly loaded into memory elements 112 through the resulting scan chains (like a conveyer belt). Then, circuit 100 is clocked for one or more cycles, toggling the relevant design-specific D-inputs and Q-outputs and combinational logic signals. Then, the resulting design-specific responses that are stored in memory elements 112 are similarly conveyed out through the daisy chains. Those versed in the art will understand the operation of scan chains in digital chips. For convenience, the present disclosure uses the simplified convention 220 of FIG. 2B to refer to each scannable memory element. Convention 220 simply labels the element as "scannable" without showing the explicit wiring connections.

Figure 3:
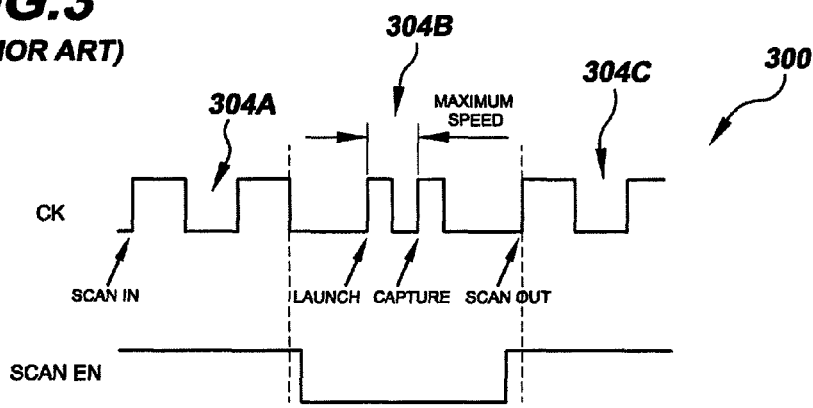
FIG. 3 is a timing diagram illustrating clock and enable signals for a conventional form of scan-based at-speed testing.

One of the drawbacks of conventional scan-based testing is that it is run at low speed. It thus does not exercise the delay faults mentioned previously. To mitigate this problem, at-speed testing is sometimes performed in which a low frequency is used when loading the scan chains (in or out) and a high frequency is used when running the test. A timing diagram 300 showing this situation is illustrated in FIG. 3. As can be seen in FIG. 3, the clock signal CK driving all the memory elements (such as memory elements 112 of FIG. 1) operates at two different speeds. During scan, it is run at low speed, as illustrated by segment 304A. Once the memory elements are loaded with the correct test data (defining a deterministic state in the circuit), a scan-enable signal, Scan EN, is toggled, thus signaling normal operation. The circuit is then clocked at fast speed (segment 304B of clock signal CK), preferably the mission-mode speed for the device under test. Then, scan is enabled again (signal Scan EN is toggled), and the captured states in all memory elements are slowly read out at the lower speed of clock CK, as seen in segment 304C.

Figure 4:
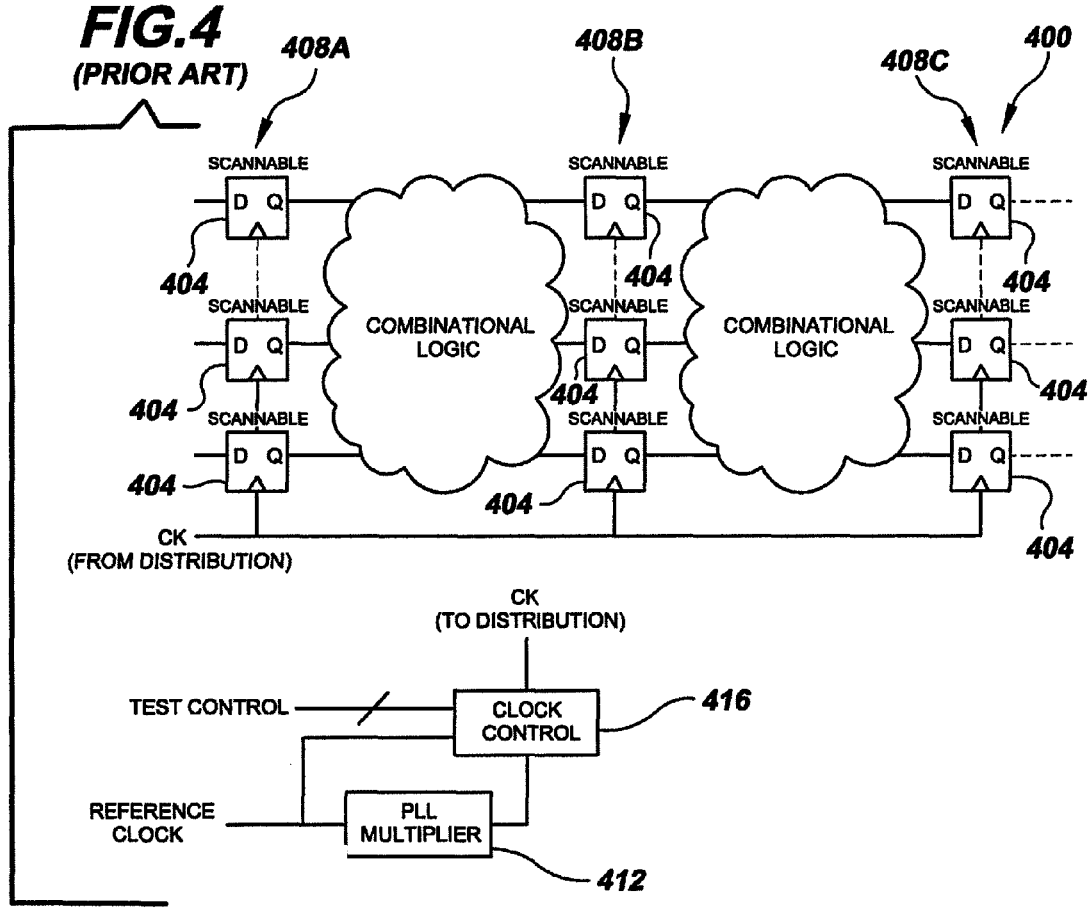
FIG. 4 is a high-level schematic diagram of digital circuitry designed for conventional scan-based at-speed testing.

In modern chips where on-chip clock multiplication occurs (as in FIG. 1), a clock control circuit is sometimes added to gate the PLL output clock depending on the test state that is required (slow scan versus at-speed functional). The resulting modification to circuit 100 of FIG. 1 is shown in FIG. 4 for completeness. As seen in FIG. 4, in the modified circuit 400 flip-flop elements 112 of circuit 100 of FIG. 1 have been replaced with scannable flip-flop elements 404. In a simple embodiment of scan-based design, flip-flops 404 in each column 408A-C of circuit 400 of FIG. 4 are daisy-chained together as a single scan chain. In general, the specific implementation may be different and is not relevant to the scope of the present invention. The important point here is the ability to generate timing diagram 300 of FIG. 3 using on-chip PLL 412 and associated clock control block 416.

Figure 5:
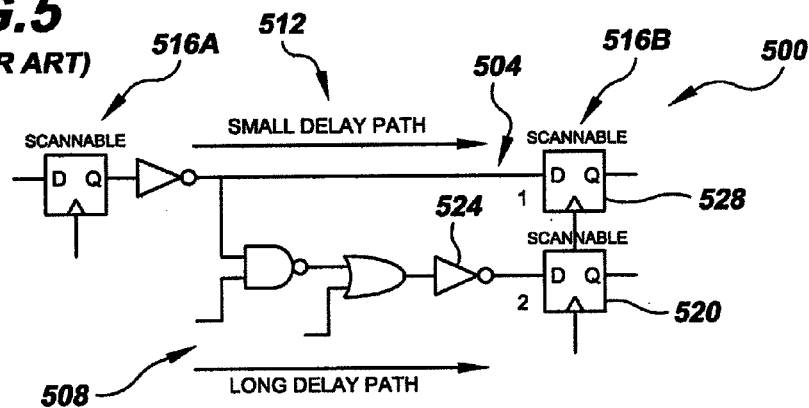
FIG. 5 is a schematic diagram of a portion of the conventional combinational logic of the digital circuitry of FIG. 4 illustrating a small delay path and a long delay path.

To detect delay faults using the above conventional DFT structures, software test pattern generation is commonly used to generate states that excite worst-case delays in a circuit. For example, FIG. 5 illustrates a portion 500 of an integrated circuit having a small delay path 504 and a worst case path 508 (a long delay path). Exciting worst case path 508 essentially means choosing one or more vectors that will cause a "0"-to-"1" or a "1"-to-"0" transition on this path. In any case, once such stressful vectors are created, they are then sometimes combined with over-clocking to enhance coverage. "Over-clocking" means running a circuit at a frequency that is faster than its mission-mode frequency. In timing diagram 300 of FIG. 3, the time between the launch and capture transitions is now reduced to a period that is even less the mission-mode period of the circuit under test. This way, stress testing is performed.

There are several flaws with this technique. For one, it may be difficult to generate the over-clock frequency using on-chip PLLs. In designs that push the envelope of performance, designing the PLL to operate at a speed that is higher than the mission speed is difficult, if not impossible, to achieve given area, power, and design-time requirements. Similarly, clock distribution networks, power distribution networks, and data paths are not designed to operate at the excessively high frequency. Over-clocking is simply too artificial for the circuit under test. A most fundamental flaw with this technique is that not all delay paths are equal inside a logic block. Referring to FIG. 5 again, this figure shows an example combinational block 512 between two memory stages 516A-B. Each of the two paths 504, 508 shown has a slightly different delay relative to the other. Over-clocking may cause flip-flop 520 on the right to fail because the three logic delays (even with no fault) become excessive for the test frequency. However, a timing fault at the output of inverter 524 will not fail flip-flop 528 on the right because there is already a lot of slack associated with this path.

2.0 Delay Fault Test Macro

Figure 6:
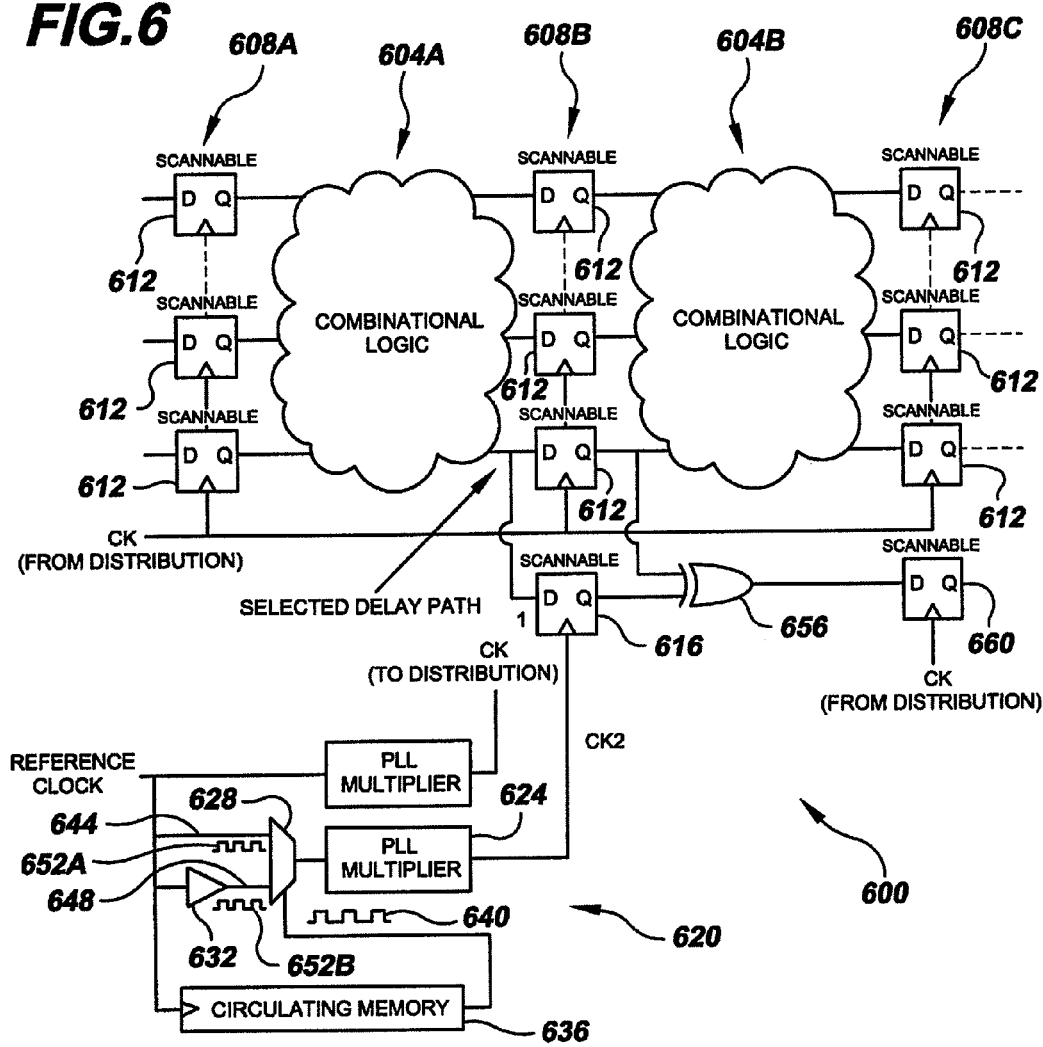
FIG. 6 is a high-level schematic diagram of digital circuitry made in accordance with the present invention that includes enhanced testing circuitry for enhancing delay-fault testing.

A first embodiment of the present invention relates to testing one or more small delay paths without over-clocking an entire circuit. This can be achieved through special circuitry and connections as illustrated in integrated circuit 600 of FIG. 6 and discussed below. To highlight the special circuitry and connections, integrated circuit 600 is based on conventional integrated circuit 400 of FIG. 4. That is, like integrated circuit 400 of FIG. 4, integrated circuit 600 includes two combinational logic blocks 604A-B and three scan chains 608A-C each containing scannable memory elements 612. However, as can be seen in FIG. 6, circuit 600 includes one or more additional scannable flip-flops (or other memory element) (only one is illustrated at element numeral 616) placed at selected locations in the circuit. The selected locations are predetermined based on the circuit design (e.g. a small delay path situation as in FIG. 5) as well as topology. CAD tools exist for performing topology-based analysis like the one required here. The analysis targets locations that are likely to have small delay paths; especially ones that can suffer from small delay faults that are not detected using conventional methods described earlier.

Still referring to FIG. 6, additional flip-flop 616 is clocked by a time-base clock signal CK2 that comes from a time-base generator 620. In this example, time-base generator 620 includes a PLL 624 (or other suitable phase filter, such as a delay-locked loop (DLL)), a multiplexer 628, a coarse delay element 632, and a circular memory 636. As described below, multiplexer 628, coarse delay element 632, and circular memory 636 work together to provide modulation circuitry for generating a rapidly varying phase signal from a reference clock signal.

Multiplexer 628 is responsive to a selection signal 640 that continually selects between two inputs 644, 648, which in this case are two versions of the circuit's reference clock signal, particularly, an undelayed version 652A and a coarsely delayed version 652B that is delayed by a coarse delay imparted by coarse delay element 632. Here, "coarse delay" is defined as any delay that is substantially larger than the minimum delay that can be reliably constructed using conventional technology. Typically, such delay is equivalent to the minimum bit period in a high speed communications device. In general and as described in U.S. patent application Ser. No. 11/776,825 titled "Signal Integrity Measurement System and Method Using a Predominantly Digital Time-Base Generator" (now U.S. Pat. No. 7,681,091), however, the selectable input signals 652A-B to multiplexer 628 may be any two or more clock signals that are coarsely delayed relative to one another. (The '825 application is incorporated herein by reference in relevant part, including all variations of the circuitry disclosed therein that corresponds to the like circuitry of time-base generator 620.) In this example, selection signal 640 comes from onboard circulating memory 636 that is clocked by incoming reference clock signal 652A. Together, multiplexer 628 and circulating memory 636 may be considered clock-selection circuitry for selecting between differing delayed versions of the reference clock signal, here delayed and un-delayed versions 652A-B. The combination of PLL multiplier 624, multiplexer 628, and coarse delay 632 to create the delayed version 652B of clock signal 652A, with selection signal 640 and onboard memory 636 driving the selection signal, constitute time-base generator 620 that replaces any analog delay lines that are required in a conventional system.

Figure 7A:
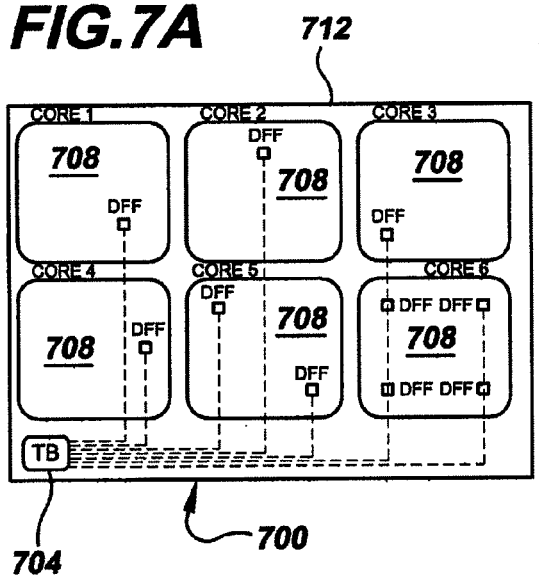
FIG. 7A is high-level schematic diagram of a multi-core integrated circuit that includes enhanced testing circuitry of the present invention deployed among the multiple cores but having a single time-base generator.
Figure 7B:
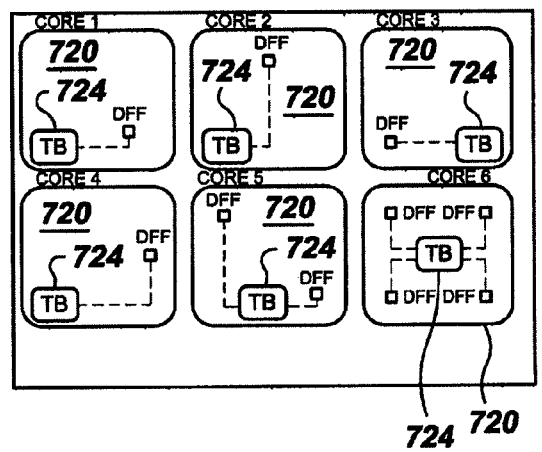
FIG. 7B is a high-level schematic diagram of a multi-core integrated circuit that includes enhanced testing circuitry of the present invention deployed among the multiple cores, wherein each core has its own time-base generator.

Time-base PLL 624 in FIG. 6 can be an existing PLL in the design that is reconfigured (temporarily) for the purposes of test according to the time-base embodiment just described. Alternatively, PLL 624 (or a DLL) can be created just for the purpose of time-base generation. In any case, time-base generator 620 is typically located at a convenient location within integrated circuit 600. For example, in a multi-core design 700 such as shown in FIG. 7A, a time-base generator 704 can be placed at a global location with respect to all the cores 708 in the integrated circuit 712. Suitable clock paths 716 can then be run to the corresponding additional scannable memory elements (here scannable D flip-flops 620) that are each similar to scannable flip-flop 616 of FIG. 6. Alternatively, and as illustrated in FIG. 7B, each core 720 may be provided with its own time-base generator 724. Of course, other configurations (not shown), such as a hybrid of the configurations of FIGS. 7A and 7B wherein some cores each have their own time-base generator and some cores share a common time-base generator, may be implemented as desired to suit a particular design.

Returning to FIG. 6, it is noted that clock control block 416 of FIG. 4 is not shown in FIG. 6. This is the case only for simplicity of the figure. If a clock control block is present for clock signal CK, then a block, which may be identical to clock control block 416 of FIG. 4, could be placed after the output of time-base generator 620 for clock signal CK2, and this block could have the same control as the corresponding control for clock signal CK.

In any case, time-base generator 612 of FIG. 6 has the property that it can program the phase of time-base clock signal CK2 with very fine resolution. "Fine resolution" is defined here as a resolution that is smaller than the minimum gate delay in the technology used. The delay imparted by time-base generator 620 is also stable and linear, thus simplifying calibration or eliminating the need for calibration altogether. By selecting a time-base delay that is shorter than the nominal edge location of clock signal CK, small delay paths can literally be measured using delay fault capture logic, for example, XOR gate 656, and an additional scannable memory element (here, flip-flop 660) at the output of the XOR gate. XOR gate 656 detects whether sampling the small delay path at an early time results in a different logical value from sampling it at the nominal time defined by clock signal CK. Essentially, clock signals CK, CK2 provides a time window, and XOR gate 656 determines whether a transition has occurred within the window defined by clock signals CK, CK2.

It is interesting to note that, effectively, embodiments of the present invention offer the opportunity to selectively "over-clock" paths within integrated circuits. It is said "effectively" because the clock is not literally run at faster speed. In other words, the clock multipliers and the power supply network, which were designed to run only at the mission-mode frequency, are not overworked.

Figure 8A:
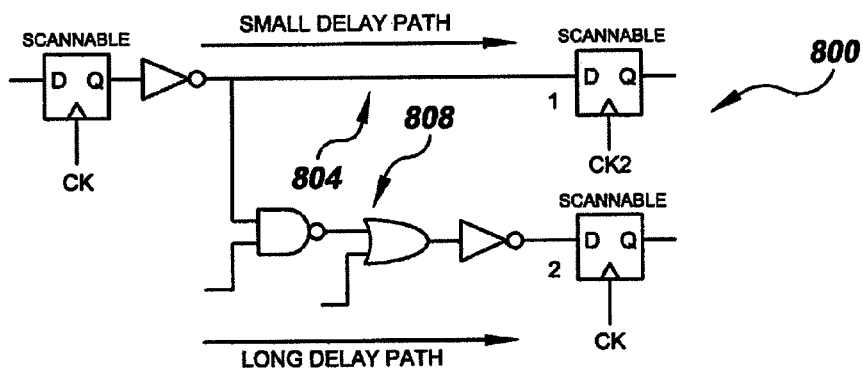
FIG. 8A is a schematic diagram of a portion of the combinational logic of the digital circuitry of FIG. 6 illustrating a small delay path and a long delay path clocked by two different clock signals.
Figure 8B:
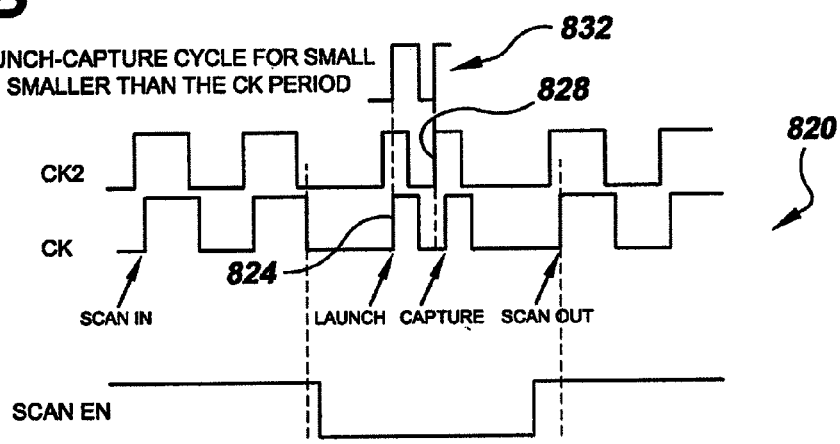
FIG. 8B is a timing diagram illustrating clock and enable signals for a scan-based at-speed testing method according to the present invention.

Referring to FIGS. 8A and 8B, FIG. 8A illustrates a portion 800 of an integrated circuit that is substantially the same as circuit portion 500 of FIG. 5. However, in FIG. 8A circuit portion 800 is clocked using the dual-clock configuration of FIG. 6. As seen in FIG. 8A, short delay path 804 is clocked by a time-base clock signal CK2 output by a time-base generator (not shown) that is the same as time-base generator 620 of FIG. 6. Long delay path 808, on the other hand, is clocked by a clock signal CK, which is identical to clock signal CK of FIG. 6.

FIG. 8B shows a timing diagram 820 for integrated circuit 600 of FIG. 6 and circuit portion 800 of FIG. 8A that illustrates how clock signals CK, CK2 essentially provide the effect of over-clocking for only the small delay paths. As seen in FIG. 8B, a data launch is triggered by a rising edge 824 of clock signal CK, whereas a data capture is triggered by a rising edge 828 of clock signal CK2. The result is the effective launch-capture cycle 832 that is shorter than each of clock signals CK, CK2. An advantage again is that a clock is not literally run fast. Another advantage is that long delay paths (e.g., long delay path 808 of FIG. 8A) is not over-clocked. Similarly, another advantage again is that fine resolution is achieved without custom delay circuits in the clock distribution network.

Before proceeding to the next section, extra scannable flip-flop 660 at the output of XOR gate 656 in integrated circuit 600 of FIG. 6 is described in more detail. The presence of flip-flop 660 is to capture the output of XOR gate 656 and convey it onto the scan chain. Thus, during production testing, pass-fail signatures include the signature of each additional flip-flop 660 in addition to the signatures from scannable memory elements 612, 616. The addition of one or more scannable flip-flops 660 does not influence the design process in any way. The value stored in each extra flip-flop 660 just needs to be verified to determine the existence of a small delay fault. In this example, if a "1" is present in extra flip-flop 660, a delay fault exists. Otherwise, there is no delay fault, and the signature in all other scan flip-flops 612, 616 can be analyzed using conventional methods.

The following sequence summarizes a process by which delay fault testing occurs according to this embodiment just described in connection with FIGS. 6-8B:
  a. During the design phase, small delay paths, such as short delay path 804 of FIG. 8A, are identified using CAD tools.
  b. During the design phase, extra scannable memory elements, such as scannable memory element 616 of FIG. 6, are added at the outputs of the identified small delay paths.
  c. During the design phase, a time-base generator, such as time-base generator 620 of FIG. 6, is included in the design using a PLL or any clock multiplier and associated time-base circuitry.
  d. At first silicon bring-up, experimentation is performed with the time-base generator (or multitude of generators) to determine an optimal sampling delay for time-base clock signal CK2. This experimentation is driven by simulation results and knowledge of the design. However, ultimately, it involves programming the time-base generator delay for clock signal CK2 at various values and determining values that correctly pass known-good devices and that correctly measure small delay paths. Using the over-clocking analogy, this step is similar to an equivalent one used in the prior art to determine the over-clocking speed for delay fault testing.
  e. During production testing, the optimal delay value of clock signal CK2 is programmed in the chip being tested.
  f. During production testing, normal scan and transition fault testing proceeds with the selected clock signal CK2 delay.
  g. During production testing, normal signature analysis from the scan chains proceeds. The scan chains include each extra scannable memory element at the outputs of corresponding fault capture logic, for example, XOR gate 656 of FIG. 6.

3.0 Delay Fault Diagnosis and Parametric Signal Integrity Measurement Macro

Figure 9:
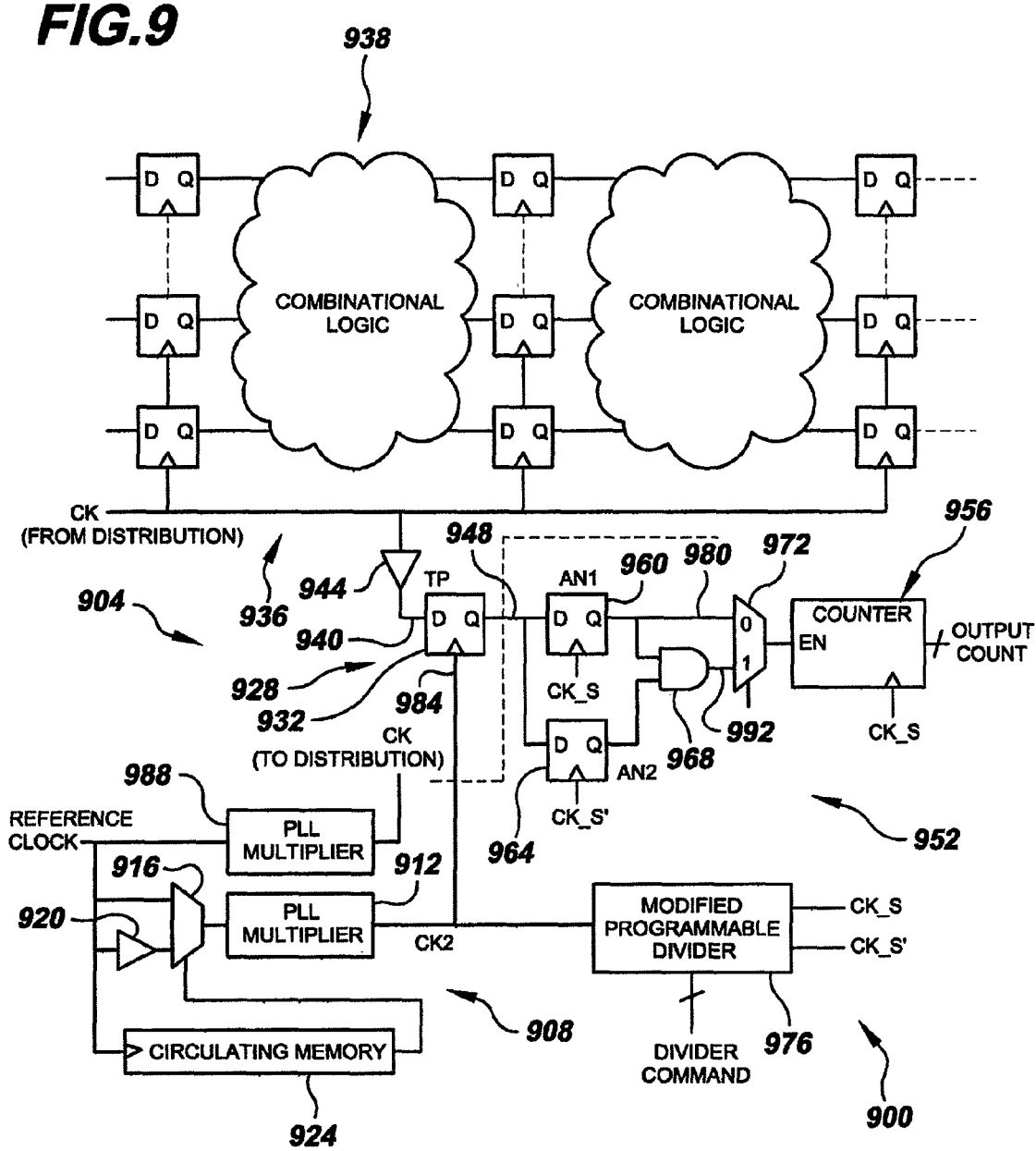
FIG. 9 is a high-level schematic diagram of digital circuitry made in accordance with the present invention that includes a macro for facilitating delay-fault diagnosis and parametric signal integrity measurement.

In the above embodiments, minimal circuitry was added to enable efficient production testing. During diagnosis or characterization, additional "parametric" tests are often desired. For example, measurement of the actual delay value through a path may be desired instead of the simple pass-fail techniques described earlier. Similarly, jitter or power supply noise information is often sought. FIG. 9 illustrates.an integrated circuit 900 that includes a signal integrity test macro 904 that enables parametric testing for delay, jitter, and power supply noise. Test macro 904 includes a time-base generator 908 located in a geographically convenient location in circuit 900 and that, in this example, includes a PLL 912, a multiplexer 916, a coarse delay element 920, and a circular memory 924. As with time-base generator 620 of FIG. 6, time-base generator 908 of FIG. 9 may be constructed using any suitable variation described for like circuitry disclosed in the '035 application mentioned above. As per FIGS. 7A and 7B, in multi-core designs time-base generator 908, can be placed at a global location with respect to all cores in the integrated circuit in the manner of time-base generator 704 of FIG. 7A, or a single time-base generator can be placed as part of each core in the multi-core design in the manner of time-base generators 724 of FIG. 7B. Of course, hybrid arrangements of time-base generators in multi-core designs are also possible.

In addition to time-base generator 908, integrated circuit 900 also includes one or more test points (only one test point 928 is shown for convenience), which in one example may each include a single D flip-flop 932 (or other sampling element), and may be distributed at various locations in the integrated circuit design as needed. The selection of the locations for test points 928 is design-dependent and is aided by simulation. The premise is that "hot" spots in circuit 900 are identified. These are spots that, for example, draw excessive amounts of current or suffer from excessive switching activity. Such locations are likely to suffer from large jitter as well. In any case, FIG. 9 shows how each test-point flip-flop 932 is connected to the circuit-under-test (CUT) 936, for example, a portions of the functional clock network associated with logic block 938. The D-input 940 of D flip-flop 932 receives clock signal CK through a potentially supply-sensitive delay element, for example buffer 944, preferably at the local clock distribution level within CUT 936, with the closest proximity to logic block 938 of interest. The concept of buffer 944 is illustrated relative to FIG. 13 below. Any implementation is acceptable, even a simple CMOS inverter. As will be apparent from the following description of the various analyses that can be performed using circuitry of macro 904, not all of the analyses, such as delay and jitter analyses, need to utilize buffer 944 (or other delay element). Therefore, if the analyses that utilize buffer 944, such as the temperature effect and power supply noise measurement analyses, are not designed into macro 904, the buffer (or other delay element) need not be provided.

Test-point flip-flop 932 is clocked by the output clock signal CK2 of time-base generator 908. The output 948 of flip-flop 932 is routed to on-board analysis circuitry 952 that, in this example, includes a digital counter 956, two analysis flip-flops 960, 964 (or other sampling elements), an AND logic gate 968, and additional support/control logic, such as a selection multiplexer 972. Just like with time-base generator 908, analysis circuitry 952 (delimited generally by analysis flip-flops 960, 964) can be placed anywhere that is convenient. Routing test-point flip-flop 932 output to analysis circuitry 952 anywhere in the chip does not degrade the measurement in any way since digital data is now being passed instead of sensitive analog signals. This way, only each sampling test-point flip-flop 932 is placed close to CUT 936. To the best of the present inventor's knowledge, this is the smallest area overhead that can be achieved for a test point. Analysis circuitry 952 also includes a programmable divider 976 that provide a sampling clock signal CK_S and a complementary sampling clock signal CK_S' to, respectively, analysis flip-flops 960, 964 and also provides signal CK_S to counter 956. Programmable divider 976 may be a conventional 50% duty cycle divider modified to provide full duty cycle output.

Delay Measurement

The way the foregoing circuitry can be used to measure delay is as follows. First, assume that programmable divider 976 is set to a clock division count of 1 (i.e. it is bypassed). Also, assume that selection multiplexer 972 at the input of the analysis counter 956 is configured to pass the "0" port 980. In this configuration, counter 956 counts the number of times (over a certain period of time) test-point flip-flop 932 captures a logical "1." If the delay induced by time-base generator 908 is smaller than the time of arrival of the signal under test (in this case, clock signal CK signal itself), counter 956 will result in zero counts. If, on the other hand, the delay induced by time-base generator 908 is larger than the arrival time of clock signal CK, counter 956 will give maximum count. For example, if counter 956 is configured to count over 1024 cycles of sampling clock signal CK_S, the output count of the counter will be 1024 since, for all cycles, the relevant edges of the signal under test (again, here clock signal CK) arrived before the corresponding respective edges of time-base clock signal CK2. If the delay of time-base generator 908 is identical to the arrival time of the edges of the signal under test, counter 956 will produce a count that is between 0 and 1024. In the unavoidable presence of some jitter on both the signal under test and time-base clock CK2, sometimes the latter will lag and sometimes it will lead. In this case, on average, counter 956 will collect a count that is very close to 512. The repeatability of this count naturally increases if more clock cycles are counted (e.g. 8192, 16384, etc. . . . ) because of statistical confidence intervals. Those versed in the art will understand the concept of statistical confidence in this context. In any case, a binary search can easily be exploited with circuit 900 of FIG. 9 to accurately and precisely measure the arrival time of a signal such as clock signal CK.

Following is an example procedure for measuring delay in the context of integrated circuit 900 of FIG. 9:

a. Set initial time-base delay; set the current time-base increment/decrement to an arbitrary maximum value (e.g. half of the coarse delay value of delay element 920 in FIG. 9).

b. Count the number of times test-point flip-flop 932 generates a logical 1 over a predetermined number of cycles, N, using counter 956.

c. If the count value after a predetermined number of cycles is approximately N/2 (within a desired tolerance), report the current time-base delay as the measured value; end the search.

d. If the count value after a predetermined number of cycles is less than N/2, increment the time-base generator delay by a current increment value.

e. Divide the increment value by 2 and go to step b.

f. If the count value after a predetermined number of cycles is more than N/2, decrement the time-base generator delay by a current decrement value.

g. Divide the decrement value by 2 and go to step b.

Figure 10:
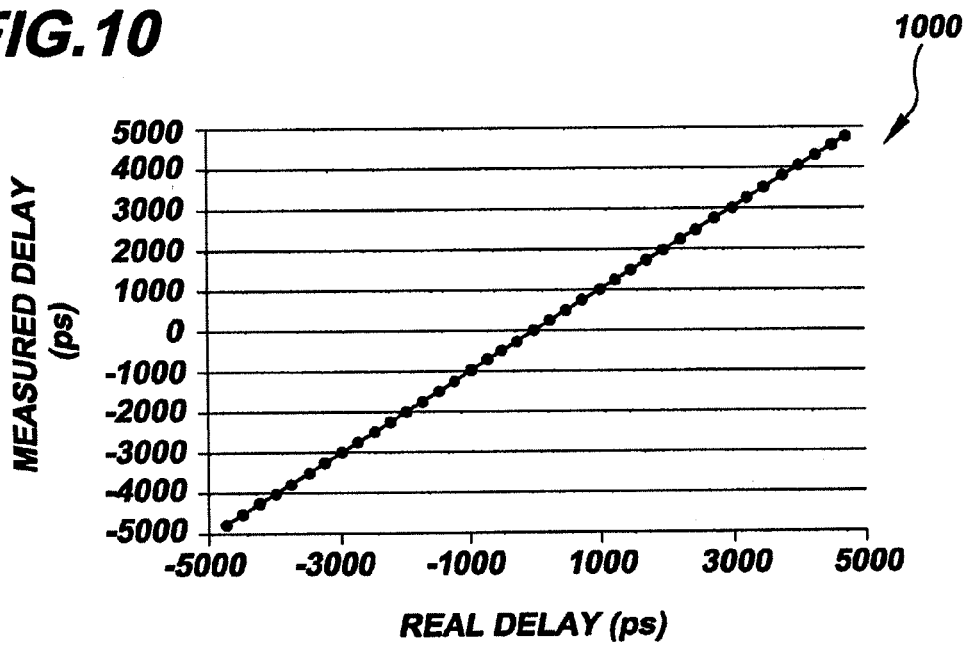
FIG. 10 is a graph of measured delay versus real delay using the macro of FIG. 9, illustrating the linearity and accuracy of the measurement.

A graph 1000 showing a sweep of a multitude of delay measurements is shown in FIG. 10. In this figure, different delay values are repetitively measured using the test point and analysis circuitry of FIG. 9. Graph 1000 illustrates the linearity and accuracy of the measurement.

Jitter Measurement

Figure 11:
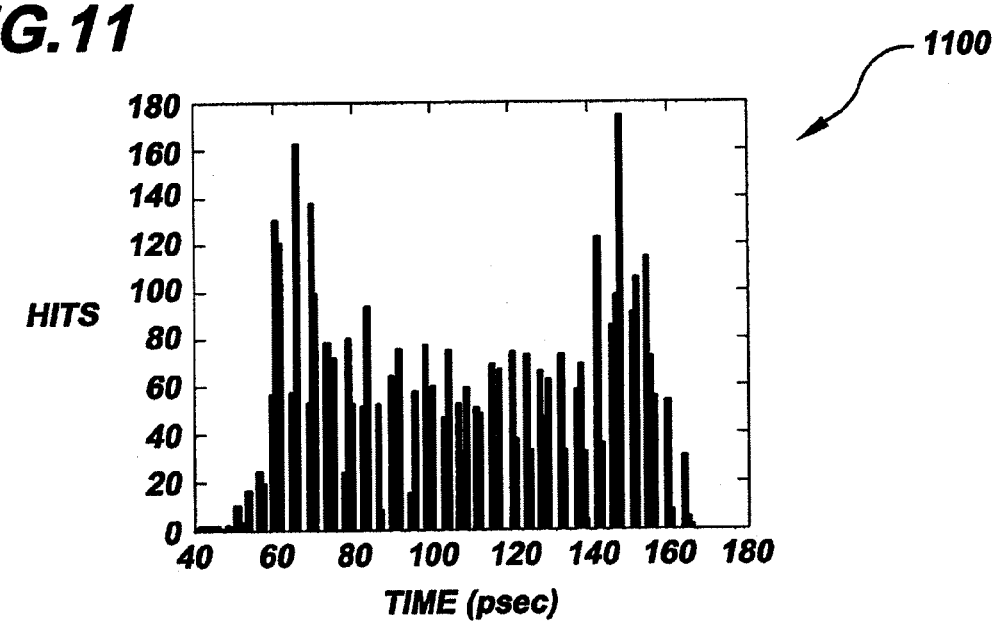
FIG. 11 is a jitter histogram created from data obtained by repetitively sweeping the output of the time-base generator of the macro of FIG. 9.

Having described delay measurement, jitter measurement is now described. The detailed procedure for jitter measurement has been described in '825 application mentioned above. The '825 application is incorporated by reference herein for the relevant teachings of jitter measurement using a time-base generator that is the same as or similar to time-base generator 908 of FIG. 9. In summary, the same configuration as described above for delay measurement is used. That is, and referring to FIG. 9, the jitter on the clock signal CK is measured with respect to time-base clock signal CK2. Time-base generator 908 is programmed to progressively sweep— in phase—its output high-frequency clock signal CK2. This way, the clock input 984 of test-point flip-flop 932 arrives at various instances with respect to D-input 940, since the latter is ultimately the output, i.e., clock signal CK, of the mission-mode non-modulated PLL 988. With such sweeping action, transition of output clock signal CK2 of time-base generator 908 sometimes occurs before D-input 940 of test-point flip-flop 932 has transitioned, and transition of clock signal CK2 sometimes occurs after the D-input has transitioned. By repetitively sweeping the output of time-base generator 908, a probability density function and a probability distribution function for the clock signal under test may be constructed. An example jitter histogram 1100 (probability density function) made using the novel circuitry of integrated circuit 900 of FIG. 9 is shown in FIG. 11. It is noted that if the testing to be performed by signal integrity test macro 904 does not require the full functionality of onboard analysis circuitry 952, for example if the macro is only going to be used for jitter measurement and delay, analysis flip-flops 960, 964, AND gate 968, multiplexer 972, and programmable divider 976 may be eliminated. Those skilled in the art will understand the modifications necessary to accommodate the changes resulting from these eliminations.

Measuring Temperature Effects

Figure 12:
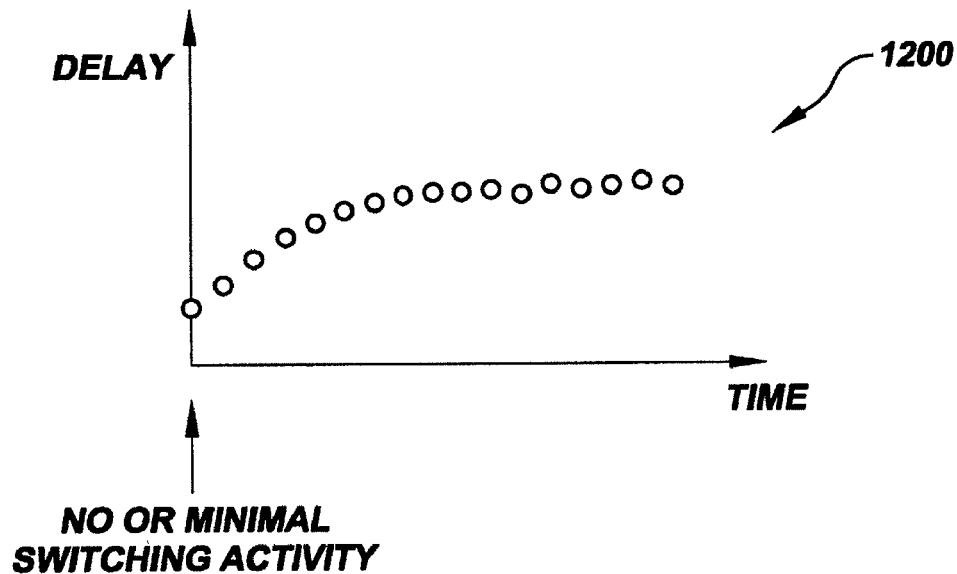
FIG. 12 is a graph of delay versus time created using a binary searching process in conjunction with the macro of FIG. 9.

Local temperature variations represent another phenomenon that needs to be characterized, especially during debug and diagnosis. When a certain CUT, for example, logic block 938 of FIG. 9, exhibits significant switching activity, more power is dissipated in the form of heat. For example, referring to FIG. 9, as integrated circuit 900 heats up, delay element 944 connected to test-point flip-flop 940 starts to drift. (Delay is proportional to temperature in digital circuits. If not, the delay element is designed to be proportional to absolute temperature). Thus, a multitude of "delay measurements" such as the one based on the binary search described above can be applied. Then, a delay-versus-time graph, such as graph 1200 shown in FIG. 12 can be constructed. As can be seen from FIG. 12, the delay eventually settles to a constant value as the operating temperature settles. As such, the best way to perform a local temperature test is to measure delay at cold temperature and then to start heavy switching activity nearby delay element 944 and start repetitively measuring delay.

Power Supply Noise Measurement

Figure 13:
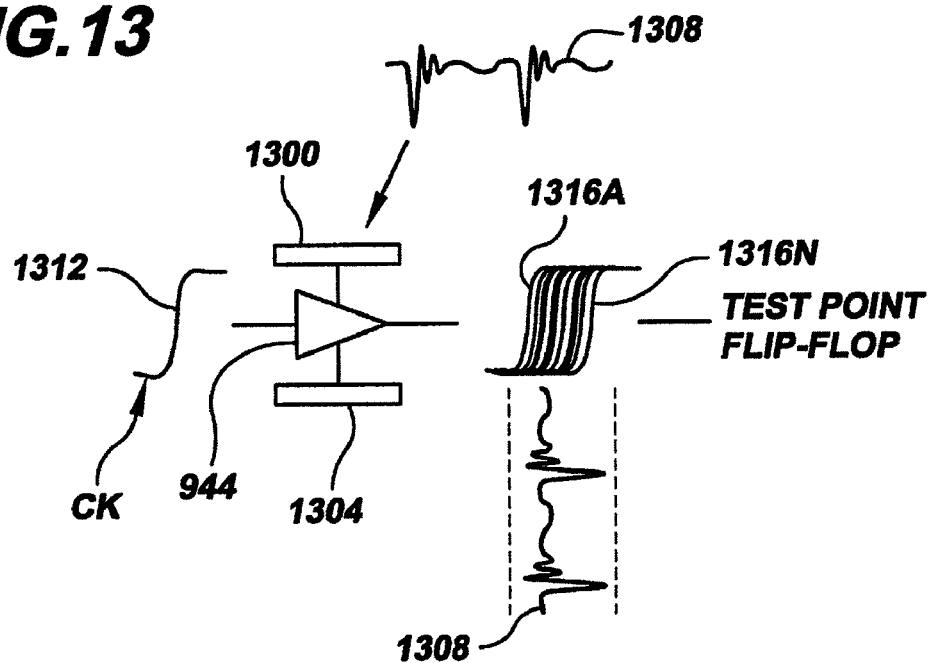
FIG. 13 is a diagram illustrating how power supply noise manifests itself as delay and jitter on a delay cell of the macro of FIG. 9.

Power supply noise is another important parameter that needs to be measured. Power supply testing can follow a procedure similar to the temperature test just described. Referring to FIG. 9, power supply noise manifests itself as delay and jitter on delay element 944. This is illustrated in FIG. 13, which shows delay element (buffer) 944 connected between power rails 1300, 1304. Power rail 1300 provides delay element 944 with a voltage signal 1308 having noise thereon. Since the output delay of delay element 944 varies as a function of the voltage of voltage signal 1308 at any given time, any particular edge 1312 of clock signal CK could be output as any one of delayed edges 1316A-N, depending on the voltage level on power rail 1300 at the relevant time. Thus, if delay element 944 is powered by a power supply grid under test (represented in FIG. 13 by power rails 1300, 1304), its delay and jitter characteristics can be analyzed.

Under heavy switching activity, the average power supply voltage is often lowered because of a finite resistance in the metal distribution networks. Given a delay cell that is sensitive to supply voltage, such delay cell would suffer from larger delay, and a test like the one described above for temperature testing can be performed. Specifically, the average delay through a test point (e.g., test point 928 of FIG. 9) is measured in a state having minimum switching activity. Then, various levels of switching activity are applied to the grid under test (e.g., the grid represented by power rails 1300 and 1304 in FIG. 13) and the delay through the test point is measured. Naturally, temperature is kept constant in this test to ensure that only the power supply drop is manifested on the test-point delay. If the switching activity is strong enough to cause a drop in the "average" supply voltage at the core or node under test, the average delay through the test point will also increase.

For more insights into the shape of the power supply noise, a jitter histogram 1100 like the one shown in FIG. 11 can be obtained. Indeed, generally, power supply noise is the dominant source of jitter in on-chip clock distribution networks. In a situation like the one illustrated in FIG. 13, the jitter histogram will look bimodal like jitter histogram 1100 of FIG. 11. If histogram 1100 is compared to a histogram corresponding to idle activity, insight into the stability of the power supply grid can be gained. In particular, the idle histogram is likely to have a single mode and to have a much narrower span.

Figure 14:
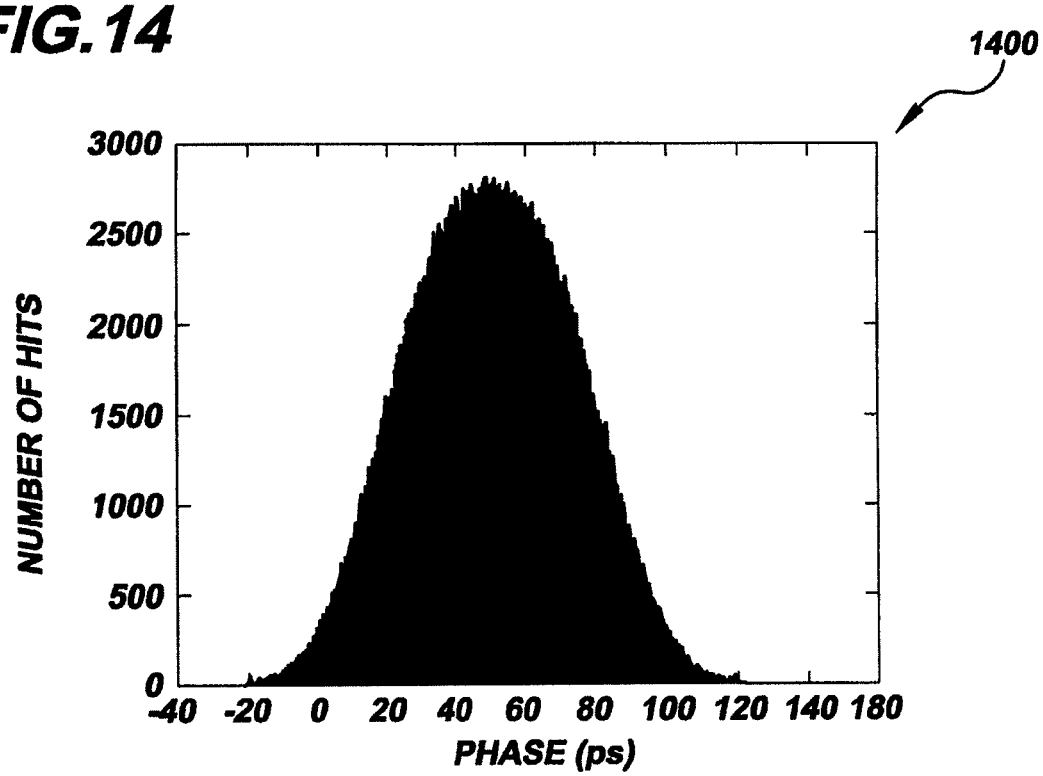
FIG. 14 is a jitter histogram of a clock period having periodic disturbances, the histogram being created from data obtained by repetitively sweeping the output of the time-base generator of the macro of FIG. 9.

While delay and histogram tests provide tremendous insight into the performance of a power distribution grid, they do not provide sufficient insight into the frequency response of the system. Depending on design sensitivities and resonances, digital circuits may be particularly susceptible to certain switching frequencies. For example, a circuit operating at 100 MHz may have power supply spurs at multiples or at integer dividers of this frequency. These spurs will manifest themselves as jitter in a delay sensitive buffer, such as delay buffer 944 of FIGS. 9 and 13; however, they are not easily uncovered from just a histogram measurement. Refer, for example, to the histogram 1400 of FIG. 14, which is a jitter histogram of a clock signal that has periodic disturbances. Histogram 1400 was obtained using the method described above. Looking at histogram 1400 alone, there is no straightforward way of uncovering the periodic spurs in the signal. However, additional test macro 904 of integrated circuit 900 of FIG. 9 allows such frequency disturbances to be uncovered. Specifically, in frequency measurement mode, select multiplexer 972 is set to the "1" input port 992. Also, programmable divider 976 operates according to divider commands present at its inputs and controls the way measurement counter 956 operates.

Figure 15:
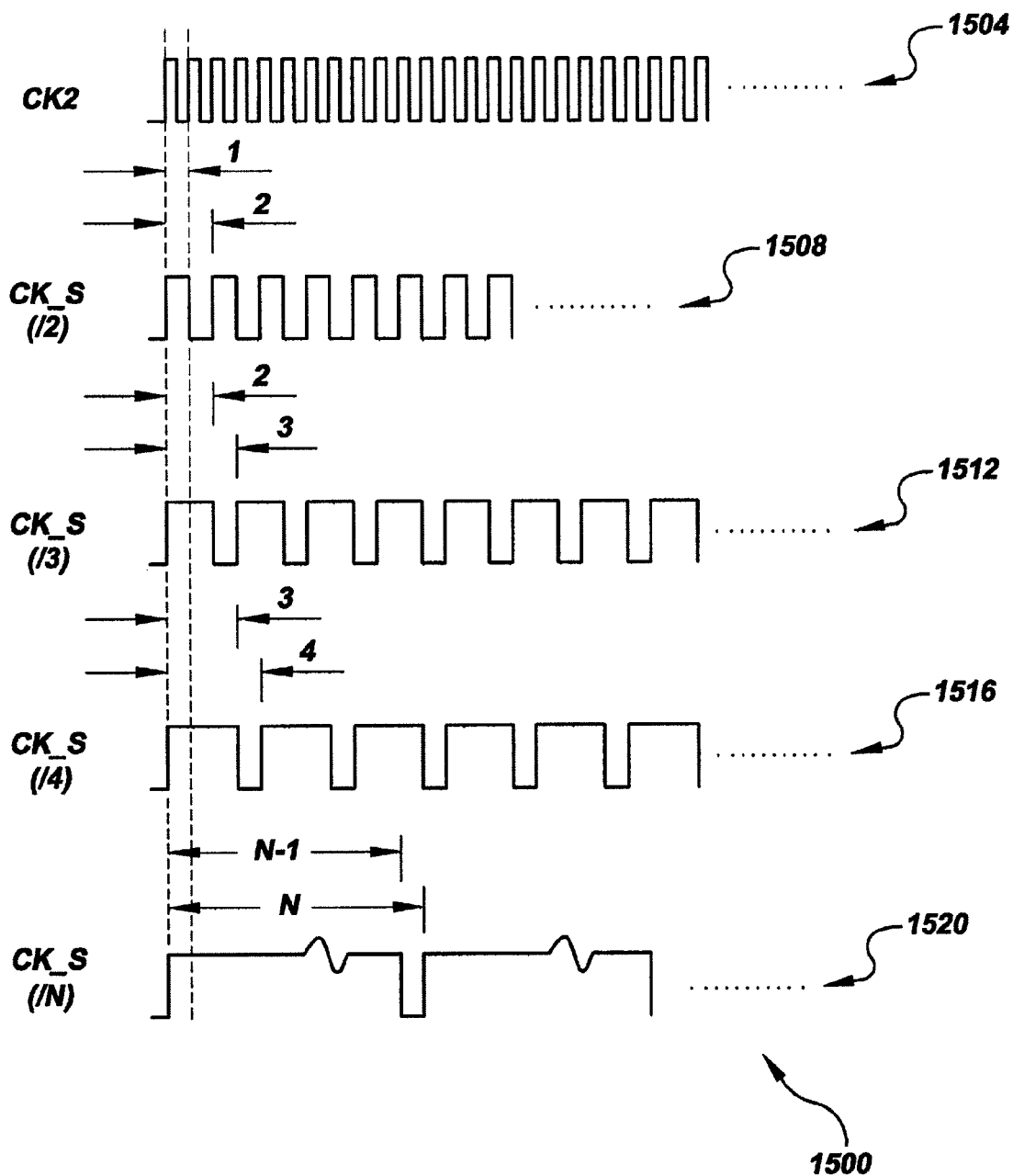
FIG. 15 is a timing diagram illustrating the operation of the programmable divider of the macro of FIG. 9.

The operation of programmable divider 976 is illustrated in the timing diagram 1500 of FIG. 15. Referring to FIG. 15, and also to FIG. 9, the first row 1504 of FIG. 15 is a depiction of time-base clock signal CK2 output by time-base generator 908. In this example, clock signal CK2 is generally equivalent to the maximum of system clock signal CK. Below the first row of FIG. 15, sampling clock signal CK_S output by programmable divider 976 is shown for different programmed divider settings. In the first case (represented in the second row 1508 of FIG. 15), divider 976 is programmed to a division ratio of two. This implements a one-cycle lag between the two analysis flip-flops 960, 964. In this example, flip-flop 960 samples its input at the rising edges of sampling clock signal CK_S. Then, flip-flop 964 samples its corresponding input at rising edges of complementary sampling clock signal CK_S' (equivalently, the falling edges of sampling clock signal CK_S, which are each one clock cycle of time-base clock signal CK2 away). Thus, flip-flops 960, 964 sample two delayed values of output 948 of test-point flip-flop 932. Then, the logical product between the two samples is performed using AND gate 968, and the result is ready for analysis counter 956 by the time the next rising edge of sampling clock signal CK_S arrives.

Once a sufficient number of products are accumulated in counter 956 (e.g. 1024 CK_S cycles), programmable divider 976 is commanded to change its division ratio to three, which is represented in the next row 1512 in FIG. 15. When it does so, it maintains a maximum duty cycle situation in which the low time of sampling clock signal CK_S is always one clock cycle. This way, the lag between the two analysis flip-flops 960, 964 is now two cycles, and once their logical product is available (in the last cycle of time-base clock signal CK2), it is accumulated in counter 956 on the next rising edge of sampling clock signal CK_S. The next row 1516 in FIG. 15 shows a timing diagram for a 3-cycle lag between the two analysis flip-flops 960, 964. Finally, the last row 1520 shows an N-cycle lag. N in this case is determined by the lowest frequency that needs to be extracted from the analysis. As an example, for a digital circuit that is clocked at 1 GHz, a 1024-long lag can provide frequency analysis down to about 1 MHz (i.e., 1 GHz/1024). The decision to go to a lower frequency is design dependent.

Having described the timing diagram in FIG. 15, a detailed procedure to extract frequency parameters is as follows. For convenience, this example refers to integrated circuit 900 of FIG. 9.

a. Determine the mean location of the signal under test. This can be performed using the binary search algorithm described above for delay measurement.

b. If not done so already, program time-base generator 908 to place its delay at exactly the mean location of the edge of the signal under test. Obviously, power supply disturbances will cause some edges of the signal under test to fall before the time-base delay and some to fall later. It is this variability that is sought and extracted in this method.

c. Enable test-point flip-flop 932 to sample every single clock transition at its input. That is, for a fixed output delay from time-base generator 908, enable the capture of a record of samples out of flip-flop 932. In the context of FIG. 9, this essentially means that the output of time-base PLL 912 is running at the same rate as functional clock signal CK and that test-point flip-flop 932 is operating normally. Each sample out of test-point flip-flop 932 is collected at the maximum frequency of the system, which is typically the mission-mode frequency of clock multiplying PLL 988. The one-bit samples out of test-point flip-flop 932 represent a sequence of one-bit phase digitization of the clock signal under test, here functional clock signal CK. That is, a "1" out of test-point flip-flop 932 means that the clock under test at the present cycle arrived before the clock phase programmed by time-base generator 908. Similarly, a "0" out of test-point flip-flop 932 means that the clock under test at the present cycle arrived after the clock phase programmed by time-base generator 908. As can be seen, real-time digitization of phase occurs at a rate equal to the frequency of functional clock signal CK. It just happens with a resolution of one bit.

d. Command programmable divider 976 to generate the timing diagram in first row 1504 of FIG. 15. Enable select multiplexer 972 to select the "1" input port 992. Analysis flip-flops 960, 964 now record the output of test-point flip-flop 932 at different time delays with respect to each other. They are controlled by sampling clock signals CK_S, CK_S' output by programmable divider 976.

e. Accumulate the output of AND gate 968 over a predetermined number of cycles, M. If the output of AND gate 968 is a "1," counter 956 increments. If it is a "0," counter 956 does not increment. This step essentially provides a measure of the correlation between the one-bit digitized samples in step d above. For example, if the outputs of analysis flip-flops 960, 964 are both high, they are highly correlated. Otherwise, if one is high and the other is low, they are not correlated. Mathematically, the accumulation of the output of AND gate 968 is similar to a sum-of-products calculation on the 1-bit digitized phase data out of test-point flip-flop 932.

f. Store the accumulated count or communicate it to, for example, a host computer for further analysis.

g. Command programmable divider 976 to generate the next timing diagram down in FIG. 15 and repeat steps d-f.

h. After N accumulated counts are obtained, observe the N-long count vector for various frequency elements. Typically, the best way to do this is by performing fast-Fourier transform (FFT) analysis on the resulting vector. Plotting the FFT can highlight the various frequency components of the jitter and, hence, the power supply noise.

Figure 16:
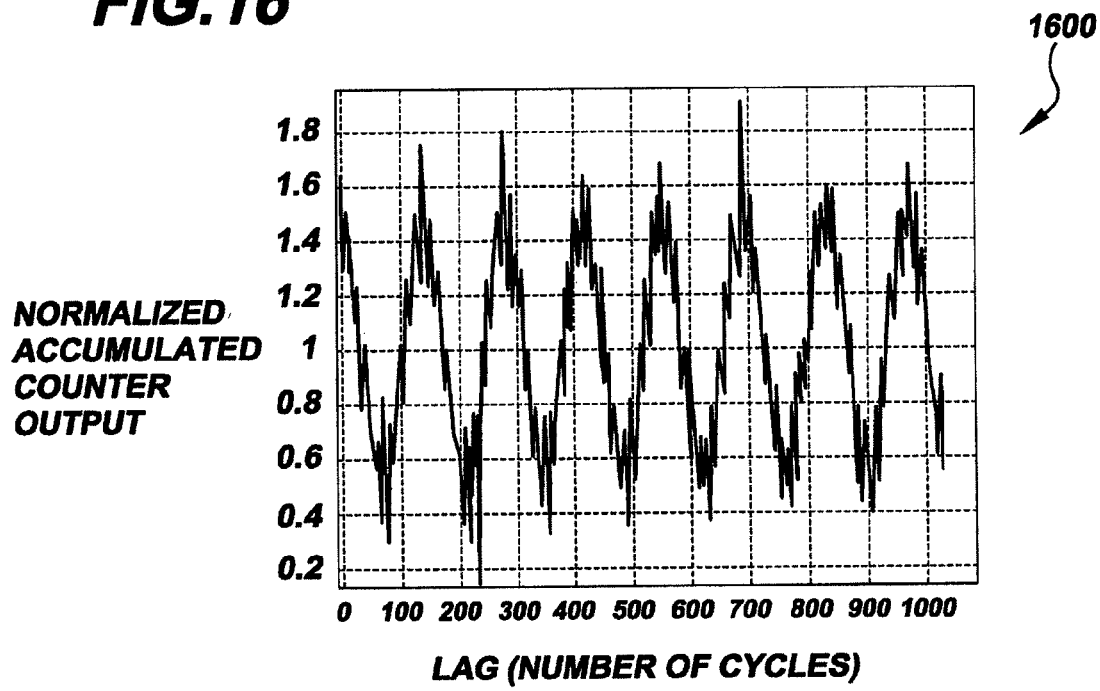
FIG. 16 is a plot of normalized counter output versus lag created by measuring correlations between delayed and non-delayed versions of a signal under test using one-bit phase digitization data, showing the periodic disturbances not seen in the histogram of FIG. 14.
Figure 17:
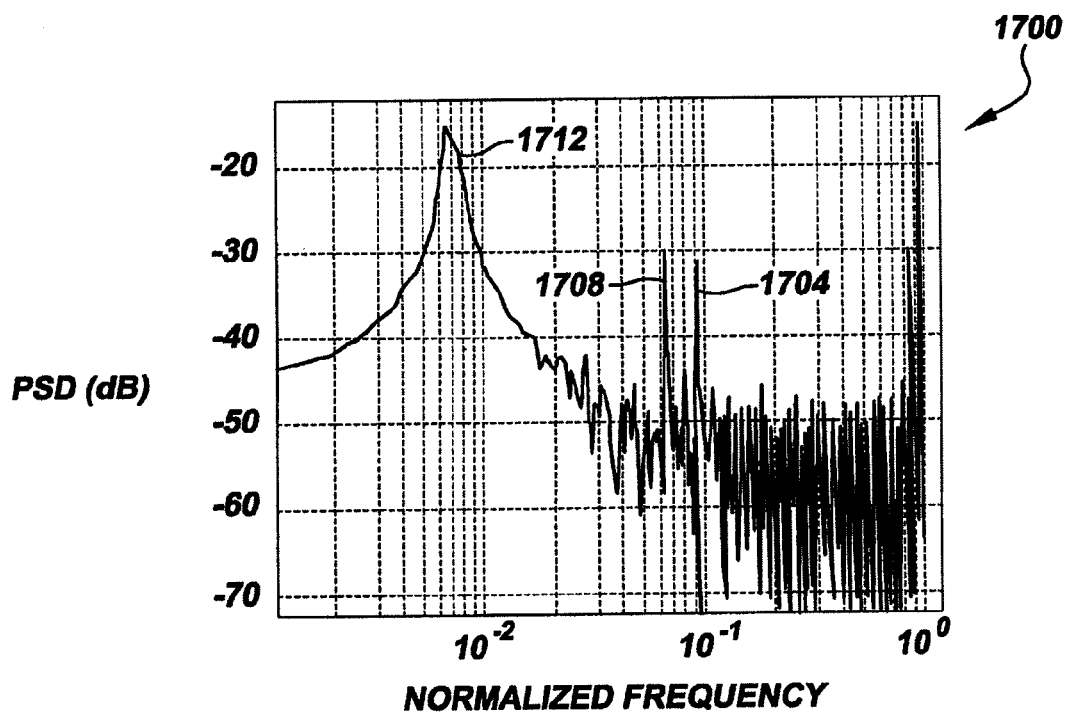
FIG. 17 is a plot of the fast-Fourier transform of the waveform of FIG. 16, illustrating three harmonic components present in that waveform.

FIG. 16 shows an example plot 1600 of the analysis counter values after 1024 lags are analyzed. Plot 1600 corresponds to the exact same conditions as those for jitter histogram 1400 in FIG. 14. As mentioned above, the periodic disturbances were not visible in histogram 1400, whereas they are visible in plot 1600 of FIG. 16. Note that plot 1600 is similar to an autocorrelation sequence in that it relies on measuring correlations between delayed and non-delayed versions of a signal under test. However, the difference is that processing here occurs on one-bit data instead of actual sample measurements. The simplification of using one-bit phase digitization enables sampling at high frequency (equal to the maximum frequency in the system) and achieves the desired frequency resolution. Indeed, high frequency components can easily be identified, as shown in the power spectral density (PSD) versus normalized frequency plot 1700 of FIG. 17, which is the result of FFT application to the waveform in plot 1600 of FIG. 16. As can be seen in FIG. 1700, three harmonic components, in particular, two high-frequency spikes 1704, 1708 and one low frequency spike 1712, are visible, and their respective powers are correctly uncovered: the two high-frequency tones possess about half the power of the single low-frequency tone.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of performing delay-fault testing on an integrated circuit, comprising:
providing an integrated circuit comprising combinational logic that includes a plurality of data paths outputting corresponding respective data bits to a plurality of memory elements;
clocking the combinational logic and ones of the plurality of memory elements with a first clock signal having a period;
simultaneously with said clocking with the first clock signal, providing a particular memory element of the plurality of memory elements with a shorter launch-capture cycle that is shorter than the period of the first clock signal, the shorter launch-capture cycle being implemented using two separate, but simultaneous, delayed clocks; and
determining whether a delay fault occurred on the particular data path of the plurality of data paths corresponding to the particular memory element provided with the shorter launch-capture cycle as a function of the shorter launch-capture cycle.

2. A method according to claim 1, wherein the plurality of data paths have differing delays and the method further comprises selecting the particular data path due to the particular data path having a short delay relative to the differing delays.

3. A method according to claim 1, wherein the combinational logic has a mission-mode speed and said clocking with said first clock signal includes clocking at the mission-mode speed.

4. A method according to claim 1, wherein said providing with a shorter launch-capture cycle includes clocking the particular memory element with a second clock signal that is delayed by a predetermined amount.

5. A method according to claim 4, further comprising generating the second clock signal by continually selecting between differing delayed versions of a reference clock to provide a combined signal and, then, phase-filtering the combined signal.

6. A method according to claim 1, wherein said determining of whether a delay fault occurred includes performing a logical operation on an output of the particular memory element and an output of an additional memory element operatively connected to the particular data path in parallel with the particular memory element.

7. A method according to claim 6, wherein said performing of the logical operation includes XORing together the output of the particular memory element and the output of an additional memory element.

8. A method according to claim 6, wherein said performing of the logical operation produces a logic result and said determining of whether a delay fault occurred includes capturing the logic result using a memory element clocked with the first clock signal.

9. A method of implementing delay-fault testing for an integrated circuit, comprising:
- during a design phase of designing an integrated circuit, identifying small delay paths from a plurality of data paths;
- providing ones of the plurality of data paths with a corresponding respective plurality of first scannable memory elements;
- providing the integrated circuit with additional, second scannable memory elements to the outputs of the small delay paths;
- providing the integrated circuit with further, third scannable memory elements in communication with corresponding respective ones of the second scannable memory elements, the third scannable memory elements for capturing delay-fault signals;
- providing the integrated circuit with a functional clock network for providing a first clock signal to the plurality of data paths and the plurality of first scannable memory elements;
- providing the integrated circuit with a time-base generator for providing a second clock signal to the second scannable memory elements, the second clock signal having a delay relative to the first clock signal;
- programming the time-base generator so that the delay is an optimal value;
- scanning appropriate data values for transition fault testing into the plurality of first scannable memory elements and the second scannable memory elements;
- performing the transition fault testing using the first and second clock signals simultaneously with one another; and
- subsequent to said performing of the transition fault testing, scanning test values out of at least the third scannable memory elements.

10. A method according to claim 9, further comprising programming the time-base generator with differing values and determining ones of the differing values that correctly pass known-good devices and that correctly measure small delay paths.

* * * * *